United States Patent [19]

Pecukonis

[11] Patent Number: 4,686,454
[45] Date of Patent: Aug. 11, 1987

[54] CONDUCTOR TRACER WITH IMPROVED OPEN CIRCUIT DETECTION, CLOSE-RANGE DISCRIMINATION AND DIRECTIONALITY

[75] Inventor: Joseph P. Pecukonis, Littleton, Colo.
[73] Assignee: Pasar, Inc., Denver, Colo.
[21] Appl. No.: 643,673
[22] Filed: Aug. 22, 1984
[51] Int. Cl.[4] .................. G01R 19/00; G01V 3/08; G01V 3/10
[52] U.S. Cl. .......................... 324/67; 324/329
[58] Field of Search .............. 324/67, 326–329, 324/457, 109, 149

[56] References Cited

U.S. PATENT DOCUMENTS

| | | | |
|---|---|---|---|
| 2,133,384 | 10/1938 | Fisher et al. | 324/52 |
| 2,651,021 | 9/1953 | Hays, Jr. | 324/52 |
| 2,993,167 | 7/1961 | Smith | 324/52 |
| 3,274,489 | 9/1966 | Behr | 324/52 |
| 3,729,675 | 4/1973 | Vosteen | 324/457 |
| 3,991,363 | 11/1976 | Lathrop | 324/67 |
| 4,134,061 | 1/1979 | Gudgel | 324/54 |
| 4,377,782 | 3/1983 | Metcalf et al. | 324/73 PC |
| 4,390,836 | 6/1983 | Bruce et al. | 324/54 |
| 4,542,334 | 9/1985 | Nelson | 324/61 R |

Primary Examiner—Ernest F. Karlsen
Assistant Examiner—Walter E. Snow
Attorney, Agent, or Firm—John R. Ley

[57] ABSTRACT

A conductor tracer apparatus includes a tracer signal generator and a detector for detecting electromagnetic and electrostatic fields created by the tracer signal in the conductor. Two electromagnetic transducers in the detector obtain an omnidirectional flux reception pattern. The separate signals from the two electromagnetic transducers are both added and compared, and the comparison obtains a directionality relationship which controls the magnitude of a display indication related to the summed signal representative of the omnidirectional flux reception. An electrostatic transducer is also provided in the detector. The signal from the electrostatic transducer is added to the signals from the electromagnetic transducers to obtain reliable conductor detection even when one of the electromagnetic or electrostatic fields is adversely influenced. The tracer signal includes a low-frequency component which may be selectively sensed by the electrostatic detector in order to distinguish the single conductor of a closely adjacent group of conductors which carry the tracer signal.

20 Claims, 9 Drawing Figures

Fig_1

Fig_2A

Fig_2B

Fig_2C

Fig_2D

Fig-3

Fig_6

Fig_5

Fig_4

CONDUCTOR TRACER WITH IMPROVED OPEN CIRCUIT DETECTION, CLOSE-RANGE DISCRIMINATION AND DIRECTIONALITY

BACKGROUND OF THE INVENTION

This invention pertains to tracing unenergized or open circuit conductors and the like; and, more particularly, doing so by directionally sensing the conductor and by discriminating the single conductor from among a plurality of closely adjacent conductors and by sensing both electrostatic and electromagnetic fields radiated from the conductor.

Current tracers are used for the purpose of tracing and identifying electrical conductors. Usually, an electrician or repairman will use a conductor tracer when searching for an electrical item or conductor in need of repair or during construction. For example, the electrician may be searching out the path of a buried electrical conductor or the path of a conductor within hidden conduits, or may be looking for specific electrical items in a breaker or junction box.

Often, the conductors must be traced and identified without interrupting the normal flow of electrical power through the conductor. Conductor tracers employed in this application superimpose a distinctive tracer signal on the electrical power signal carried by the conductor. This distinctive signal is sensed in order to trace the conductor. An invention of the inventor hereof and assigned to the assignee hereof, entitled TRACING ELECTRICAL CONDUCTORS BY HIGH-FREQUENCY LOADING AND IMPROVED SIGNAL DETECTION, now U.S. Pat. No.4,491,785, relates to a conductor tracer wherein the normal flow of electrical power is maintained in the conductor when it is traced. When the normal flow of electrical power can be interrupted, conductors can be traced using a certain type of tracer which injects or applies a tracing signal to the unenergized conductor. The tracing signal is conducted through the unenergized closed circuit in which the conductor is a part. In those tracers which superimpose a distinctive tracer signal on the normal power signal and those tracers which inject a tracer signal, a closed circuit is usually required or is desirable to obtain enough tracer signal-current flow to create a sufficient electromagnetic field which can be detected. With insufficient or low current flowing through the conductor, the strength of any electromagnetic field will usually not be sufficient for reliable and effective electromagnetic detection.

In situations of broken or open conductors, the normal flow of electrical power cannot be maintained through the conductor. To trace such conductors, it is nevertheless necessary to inject the tracing signal into the broken or open conductor. However, in the situation of a broken or open conductor, usually there is insufficient current flow in the conductor to cause an electromagnetic field to be radiated. Any current which does flow in an open circuit normally is the result of inherent distributed capacitance along the conductor at the high or radio frequencies normally inherent in tracer signals. Obtaining reliable and effective detection of conductors which are broken or open is a substantial problem, and even more of a problem is obtaining reliable and effective detection from a single conductor tracer which may be used in both open circuit and closed circuit situations.

The high frequency signal component of the tracing signal effectively propagates to other adjoining conductors and adjacent metallic structures. Although the radiation effects are essential to the primary function of tracing the conductor, they can also be detrimental in trying to determine which one of a plurality of closely grouped conductors in a bundle is actually the one which carries the signal, since the signal propagates to all of the group conductors.

When the conductor is concealed, for example in the earth or in walls of a building structure, it is somewhat difficult or time consuming to attempt to follow the path of the conductor because changes in direction and location of the conductor are not readily apparent except as a result of sensing the strength of the signal. Adjacent structures and materials may either insulate or magnify the effects of propagation and create electromagnetic wave nodes of varying signal strength which may either obscure the true path or location of the conductor or may give false senses as to the actual path followed by the conductor. Sensing the changes in direction of the path of the conductor under such circumstances is somewhat difficult and time consuming. Furthermore, the manner of signal propagation from the conductor itself may vary along its length due to the effects of breaks, short circuits, insulation, shielding and electrical devices connected to the conductor. Hence, the tracer signal itself may undergo changes which can adversely influence its propagation characteristics and hence the convenient ability to detect and discriminate the tracer signal.

BRIEF SUMMARY OF THE INVENTION

The present invention teaches techniques for effectively tracing conductors in both open circuit and continuous circuit situations, for distinguishing the single one of a plurality of closely grouped conductors which carries the tracer signal from the other adjacent conductors in the group, and for quickly sensing the direction or path of a conductor carrying the tracer signal.

In accordance with one of its major aspects, an apparatus for tracing and identifying electrical conductors or the like comprises a generator in combination with a detector. The generator operatively generates a tracer signal and applies the tracer signal to the conductor. The detector is operative to detect the tracer signal when placed in operative proximity with the conductor. The tracer signal includes a high-frequency component which creates corresponding high-frequency fluctuating electromagnetic and electrostatic fields about the conductor. The detector includes both an electromagnetic transducer and an electrostatic transducer, which each obtain separate output signals responsive to the sensed electromagnetic and electrostatic fields, respectively. Both signals derived from the electromagnetic and electrostatic transducers are added together and a display indication is derived from this composite or summed together signal. By summing signals representative of the detected electromagnetic and electrostatic fields, more reliable detection is achieved. The various influences which may adversely affect one of the electromagnetic or electrostatic fields will usually not affect the other.

Another one of the major aspects is an improved electrostatic detection capability wherein the adverse affects of stray and spurious background electrostatic fields are eliminated or substantially reduced in order to achieve more reliable electrostatic field detection. A field sensing electrode is provided and a driven shield electrode substantially surrounds and shields the field sensing electrode except at that portion of the field sensing electrode which is primarily operatively exposed to receive the electrostatic fields. An amplifier, preferably connected in a substantial voltage following arrangement, receives its input signal from the field sensing electrode and supplies its output signal to the driven shield electrode. The voltage of the driven electrode essentially tracks or parallels the voltage created by the impinging electrostatic field on the field sensing electrode, and this feedback arrangement substantially eliminates the effect of spurious and background electrostatic fields, while still obtaining a sufficient capability to detect the electrostatic fields created by the tracer signal when the detector is placed in operative proximity with the conductor.

In accordance with still another aspect of the present invention, an improved short or close-range electrostatic sensing capability is provided to distinguish the one of a plurality of conductors in an adjacent bundle or group which carries the tracer signal. The tracer signal delivered by the generator includes a repetitious cycle envelope wherein during a first portion of the cycle envelope the voltage level is modulated at the predetermined high frequency. The cycle envelope is repetitiously supplied at a predetermined low frequency. During the first portion of the cycle envelope, the voltage is constantly above that level of voltage during the second portion of the cycle envelope by a predetermined offset amount. Means of the detector directly senses the relatively low-frequency electrostatic field created by the voltage offset and creates a display indication using this detected offset signal. The relatively low frequency prevents the electrostatic field associated with the voltage offset from coupling to the other adjoining conductors of the group. By placing the detector in direct operative adjacency with each conductor of the group, the conductor carrying the tracing signal can be identified and distinguished from the others.

Another aspect of the present invention pertains to an improvement for indicating the direction of the conductor with respect to a reference direction of the detector, while obtaining an improved capability for detecting electromagnetic radiation in more of an omnidirectional pattern without the adverse influences of wave cancellation characteristics and the like. A pair of electromagnetic transducers are provided, and each transducer is physically oriented to have a maximum flux reception capability in a direction angled with respect to the other electromagnetic transducer. The angular orientation of the two electromagnetic transducers assures the derivation of separate signals of strength related each to the angular orientation of the respective electrostatic transducers. The signal sensed by the electrostatic transducer is added to the two separate signals derived by the electromagnetic transducers. The strength of the signals from the electromagnetic transducers are operatively compared and an error signal is obtained. This error signal contains information relating to the orientation of the conductor with respect to a reference direction of the detector. A display indication related to the reference signal indicates when the conductor is directionally in line with the reference direction of the detector and when the conductor is off to one side. A maximum display indication occurs when the detector is pointed at the conductor and the display indication is diminished when the detector is pointed to one side of the conductor. By pointing the detector from side to side and by watching the display indication, the direction of the conductor is readily ascertained. A related effect occurs with the electrostatic transducer because the orientation of the field sensing electrode should be perpendicular to a line to the conductor in order to obtain the maximum electrostatic field signal and display indication. However, since the electrostatic field signals are added to the signals of the two separate electromagnetic transducers, the electrostatic signals do not influence the magnitude of the error signal derived by comparing the signals from the electromagnetic transducers. Thus, although an omnidirectional field sensing capability is available, the electromagnetic signal strength comparison feature allows the direction sensing path to have precise narrowly defined limits, as established by the effects of the error signal on the magnitude of the display indication supplied. The field sensing paths can thus be defined and refined electrically, without the less precise and potentially adverse influences of overlapping flux patterns, cancellations and the like.

The features of the invention are more specifically recited in the appended claims. A more detailed understanding of the invention can be obtained from the following detailed description of a preferred embodiment of the invention taken in conjunction with the drawings.

DESCRIPTION OF THE PREFERRED EMBODIMENT

Figure 1:
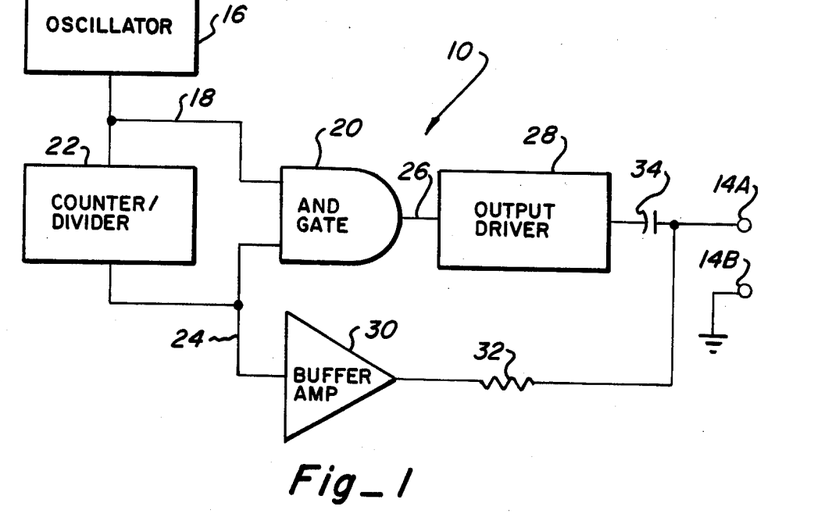
FIG. 1 is a block and schematic diagram of a tracer signal transmitter or generator of the conductor tracer of the present invention.
Figure 3:
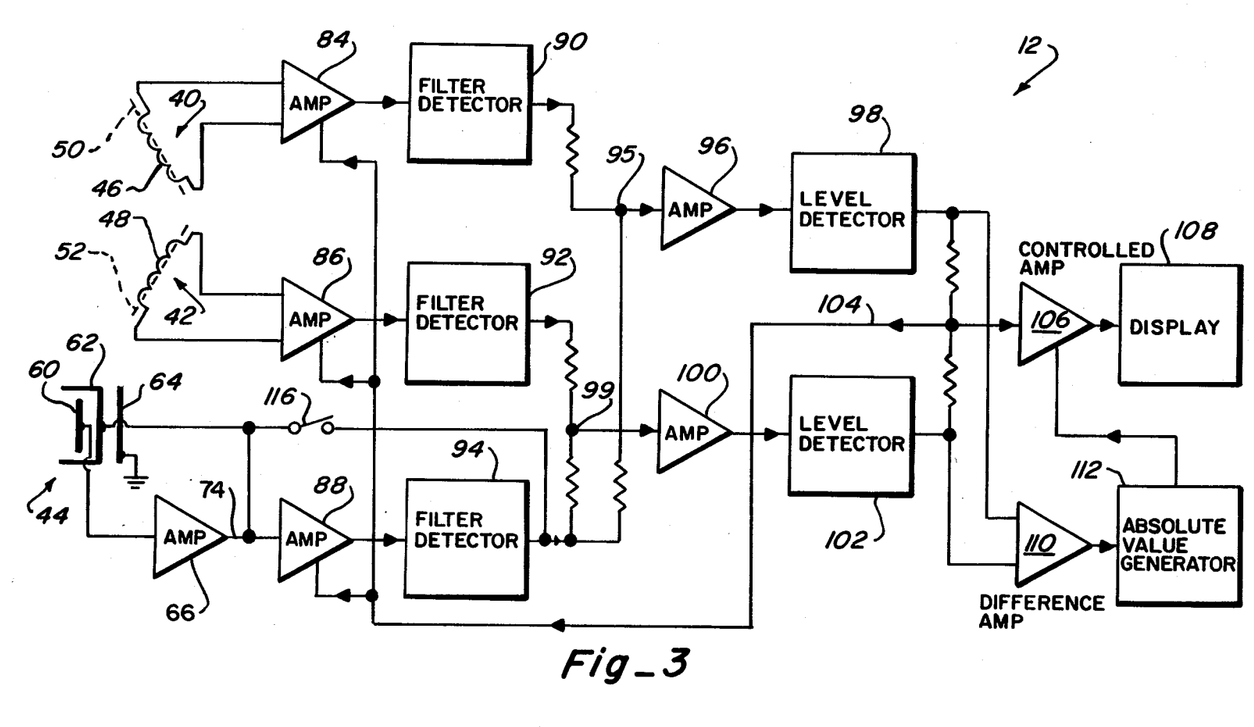
FIG. 3 is a block and schematic diagram of a tracer signal detector or receiver of the conductor tracer of the present invention.

The two major components of the current tracer described herein are a tracer signal transmitter or generator 10, shown in FIG. 1, and a tracer signal detector or receiver 12, shown in FIG. 3. The generator 10 is adapted to be connected to the unenergized open or closed circuit conductor which is to be traced. The tracer signal created by the generator 10 is transmitted over the unenergized conductor, and the tracer signal radiates electromagnetic wave and electrostatic field energy from the conductor. The radiated energy has characteristics which correspond to the characteristics of the electrical tracer signal delivered by the generator 10 over the unenergized conductor. The detector 12 includes electromagnetic and electrostatic transducers which respond to the energy from the conductor created by the tracer signal when the detector 12 is placed in operative physical proximity to the conductor. As the detector is physically moved into sufficiently close proximity to the conductor carrying the tracer signal, the receipt and detection of the electromagnetic and/or electrostatic energy causes the detector to provide a display indication indicating the proximity of the detector 12 to the conductor. The conductor is thereby distinguished and identified with respect to other conductors not carrying the tracer signal. The features of both the generator 10 and the receiver 12, which are described in greater detail below, obtain substantial improvements in conductor tracers.

The detector 10, which is shown in FIG. 1, includes a pair of output terminals 14A and 14B, through which the generator tracer signal is applied to the unenergized conductor. The tracer signal is present at terminal 14A, while terminal 14B is connected to reference potential or ground. A conventional connector (not shown) connects the terminals 14A and 14B to the conductor and to the ground reference, respectively.

Figure 2A:
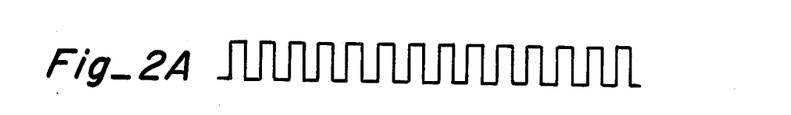
FIGS. 2A, 2B, 2C and 2D are wave form diagrams illustrating signals present in the tracer signal generator shown in FIG. 1.

A conventional high-frequency or radio frequency oscillator 16 applies a signal to conductor 18 at a predetermined high frequency, typically at radio frequency. An illustration of the waveform of the signal present on conductor 18 is shown in FIG. 2A. In actuality, the frequency of the signal on conductor 18 is the frequency of the high-frequency component of the tracer signal present on the unenergized conductor. In actual application, a high-frequency of approximately five hundred kilohertz has proved satisfactory.

Figure 2B:
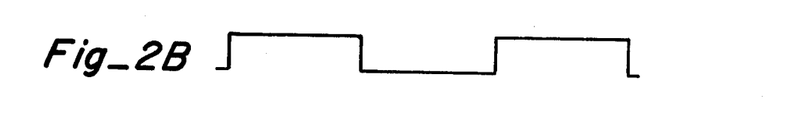

The high-frequency signal present on conductor 18 is applied to one input terminal of a conventional AND gate 20 and to the input terminal of a conventional counter divider 22. The counter divider 22 counts a predetermined number of pulses of the predetermined high-frequency signal and changes states and resets upon reaching the predetermined count number. The output signal from the counter divider 22 is applied on conductor 24 and is a waveform illustrated in FIG. 2B. The output signal from the counter divider 22 defines each cycle of the tracer signal, and is thus designated a cycle signal. The frequency of the cycle signal on conductor 24 is considerably less than the frequency of the high-frequency signal present on conductor 18, because of the predetermined number of high-frequency pulses which are counted before a change of state of the counter divider 22 occurs. In actuality, the frequency of the cycle signal is preferably in the audio range.

Figure 2C:
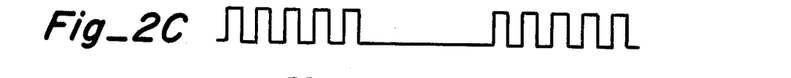

The AND gate 20 receives the cycle signal on conductor 24 and the high-frequency signal on conductor 18 at its input terminals. The output signal from the AND gate 20 on conductor 26 is shown in FIG. 2C. A series of high-frequency signals is conducted or passed by the AND gate 20 during the on time or high component of the cycle signal shown in FIG. 2B. During the off time or low component of the cycle signal, the signal level on conductor 26 is low or off. A conventional output driver 28 receives the periodic series of high-frequency signals and increases the amount of current conducted during each series of high-frequency signals.

The cycle signal on conductor 24 is also applied to the input terminal of a buffer amplifier 30. The output signal from the buffer amplifier 30 is supplied through a resistor 32 directly to the output terminal 14A. The buffer amplifier 30 achieves a predetermined amplification of the cycle signal to create a predetermined voltage and current level at the output terminal 14A with respect to the ground terminal 14B during the on time of the cycle signal. The buffer amplifier 30 also buffers the AND gate and counter divider 22 from the tracer signal present on the conductor 14A.

The periodic series of high-frequency signals supplied by the output driver 28 is coupled through a coupling capacitor 34 to the output terminal 14A, due to the high frequency component of the signal. Each series of high-frequency current magnified signals from the output driver 28 and the voltage amplified high component of the cycle signal from the buffer amplifier 30 are simultaneously present on terminal 14A. Because of the effects of the capacitor 34, an addition of the two signals occurs at terminal 14A.

Figure 2D:
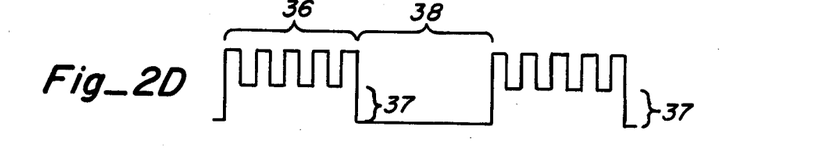

The resulting tracer signal present at the output terminal 14A is shown in FIG. 2D. The tracer signal is a cyclically repetitious waveform wherein each cycle is characterized by a waveform envelope having a high or active portion 36 wherein the amplitude is modulated by the series of high-frequency signals and to an extent such that the voltage level of the portion 36 is constantly greater by a predetermined amount of voltage offset 37 than that voltage present during an off or second portion 38 of the waveform envelope when no signal is transmitted. Stated differently, the voltage offset 37 is greater than the voltage level during the off portion 38 of the waveform envelope. The radio or high frequency component of the tracer signal (established by the series of high frequency pulses, FIG. 2C) creates the radiated high-frequency electromagnetic and the fluctuating electrostatic fields which have substantial penetration and propagation characteristics. The low-frequency component of the tracer signal (established by the cycle signal, FIG. 2B) creates a relative non-propagating low-frequency electrostatic field of magnitude related to the voltage offset.

Both the high-frequency electromagnetic and electrostatic characteristics of the tracer signal are useful in tracing the conductor when the mode of propagation along the conductor changes and when unforeseen influences affect the effectiveness of the propagation characteristics of either the electromagnetic or electrostatic high-frequency components of the tracer signal. Successful tracing and detection is less susceptible to opens, breaks, shorts, insulation effects, shielding effects or differences in mode of propagation than in previous tracers, because the occurrence of one such influence usually affects only one of the electromagnetic or electrostatic fields while the other field remains unaffected and of sufficient strength to be reliably detected. The voltage offset characteristic present in the tracer signal creates a low-frequency periodic electrostatic effect on the conductor, and this low-frequency electrostatic characteristic does not readily couple or propagate to adjoining conductors so it is sensed to distinguish the conductor carrying the tracer signal from a plurality of adjacent conductors in a closely adjacent or adjoining group. The high-frequency radiated electromagnetic waves created by the tracer signal are also used by the detector to achieve a directionality sensing capability to direct the user more quickly to the location of the conductor. The end result is an improved and more consistently reliable detection capability available from the present invention. These improvements, capabilities and features are more readily understood with reference to the detector shown in FIG. 3.

As shown in FIG. 3, the detector 12 comprises a pair of electromagnetic transducers 40 and 42 and one electrostatic transducer 44. Each of the two electromagnetic transducers 40 and 42 responds to the high-frequency component of the electromagnetic field corresponding to and created by the high-frequency component of the tracer signal. The electrostatic transducer responds to both the high-frequency field and the low-frequency voltage offset field caused by the voltage characteristics of the tracer signal on the conductor. All three transducers may be respectively responsive to the electromagnetic and electrostatic field effects created by the tracer signal when tracing the conductor. Under those adverse conditions which may influence one of the high-frequency electromagnetic or electrostatic fields created by the tracer signal, the detector nevertheless remains capable of responding to the other one of the electrostatic or electromagnetic fields to achieve detection and identification of the conductor.

Figure 4:
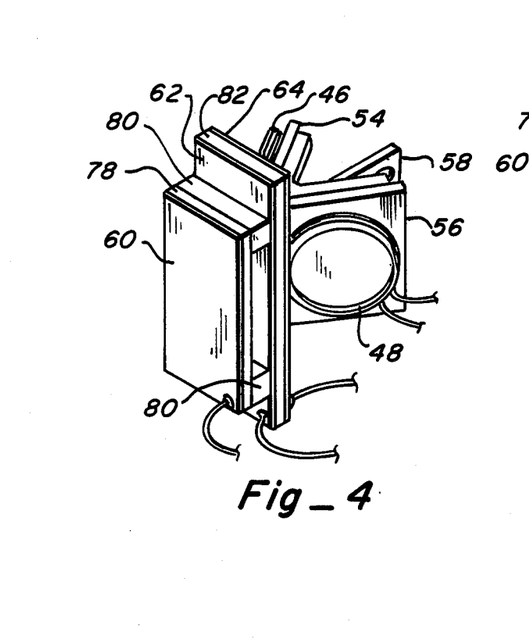
FIG. 4 is a perspective view of a portion of the tracer signal receiver illustrating mechanical details of an electrostatic transducer and electromagnetic transducers of the tracer signal receiver shown in electrical form in FIG. 3.
Figure 5:
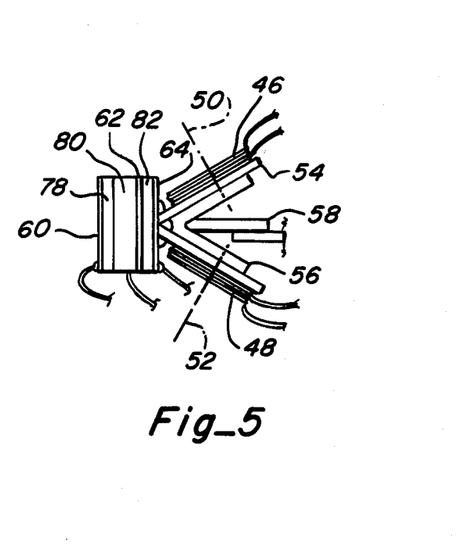
FIG. 5 is a top plan view of FIG. 5.

Each electromagnetic transducer 40 and 42 comprises a conventional air-core wire-wound coil or pickup 46 and 48, respectively. The coils 46 and 48 are wound concentrically with respect to coil axes 50 and 52, respectively. The coil axes 50 and 52 generally define a line along which electromagnetic flux which has a maximum inductive effect on the coils 46 and 48, respectively. The coils 46 and 48 are positioned with their coil axes 50 and 52 at an intersecting angle of between ninety and one hundred eighty degrees, and preferably approximately one hundred twenty degrees. The physical position of the coils 46 and 48 is illustrated in FIGS. 4 and 5. Each coil 46 and 48 is respectively attached to a backing support 54 and 56 by a noninductive adhesive. The two backing supports 54 and 56 are connected to a single structural element 58 extending along a bisection of the angle of the backing supports 54 and 56. The structural element 58 thereby extends or points toward a forward or leading or pointing position of the detector. This forward pointing reference position is the direction in which the user points the detector when tracing a conductor. This forward pointing reference position is also the position from which the field energy impinges on the transducers.

Each coil 46 and 48 inductively derives its own electrical signal of magnitude or amplitude which depends on the amount of electromagnetic flux intercepted by or encompassed within the center of the coil. If the detector is pointed directly toward the conductor, i.e., the structural element 58 is pointed directly at the conductor, both coils 46 and 48 intercept approximately the same amount of electromagnetic flux radiated in waves concentrically outward from the conductor. When the detector is pointed away from the conductor, one of the coils 46 or 48 intercepts more electromagnetic flux than the other coil and the magnitude of the electrical signal induced in the coil intercepting the greater amount of flux is greater in magnitude than the electrical signal induced in the other coil. This difference in magnitude of the induced electrical signals is utilized to obtain the capability to detect the direction of the conductor with respect to the direction in which the detector itself is pointed. The electrical signals induced separately in each of the coils are both utilized to obtain an omnidirectional or expanded flux detection capability which does not depend on the orientation of just a single coil or the various flux reception peculiarities and nodes associated with the single coil. Detection of the radiated electromagnetic field is more reliably achieved and less susceptible to the uncertainties of node cancelling effects and detector orientation typical in conventional prior conductor tracers.

Figure 6:
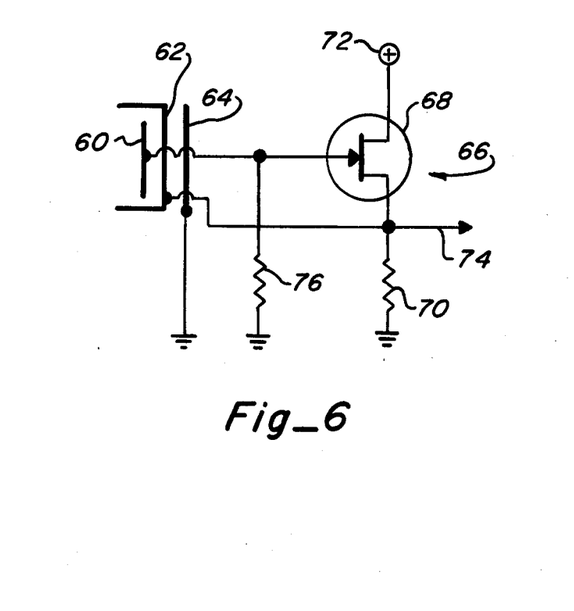
FIG. 6 is a schematic diagram of a portion of the tracer signal receiver shown in block diagram form in FIG. 3.

The electrostatic transducer 44 shown in FIG. 3 comprises a field sensing electrode 60, a driven guard or shield electrode 62, and a reference shield electrode 64. An amplifier 66 is electrically connected between the field sensing electrode 60 and the driven guard 62 in a relationship wherein the amplifier input signal is derived from the field sensing electrode 60 and the amplifier output signal is applied to the driven guard 62. FIG. 6 illustrates schematically these elements wherein the amplifier 66 is a field effect transistor 68. A resistor 70 is connected from the source of the field effect transistor 68 to reference potential and the drain of the field effect transistor 68 is directly connected to a power supply 72. Accordingly, the field effect transistor 68 is connected in a voltage follower or source follower relationship. The gate of the field effect transistor 68 is directly connected to the field sensing electrode 60. The output signal from the field effect transistor 68, which virtually directly follows the input signal on the field sensing electrode 60, is applied to conductor 74 and the driven guard 62. Resistor 76 creates a voltage signal on the gate electrode when the field sensing electrode 60 is influenced by an electrostatic field, and this signal corresponds to the strength of the electrostatic field sensed by the electrode 60.

The driven guard 62 serves a very important function in obtaining improved electrostatic sensing capability. By causing the voltage on the driven guard 62 to virtually directly follow the voltage created by the electrostatic field on the field sensing electrode 62, the effects of spurious surrounding and background electrostatic fields are virtually eliminated. The background electrostatic fields will generally be of a sufficient magnitude to mask or otherwise prevent the reliable and distinctive detection of th electrostatic fields created by the tracer signal, if the driven guard 62 was not provided. Even though there is virtually an instantaneous full feedback effect created by driving the driven guard 62 with a voltage approximately equal to that created by the electrostatic field influences on the electrode 60, the signal present on conductor 74 is sufficient to be detected. As an example of the substantially improved electrostatic sensing achieved, it is possible to follow the path of a conductor buried approximately six feet underneath relatively dry earth by electrostatic sensing, with a nine volt tracer signal applied to the conductor. The reference shield 64 is connected to electrical reference potential to isolate the driven guard 62 from the field effects of other circuit elements in the detector.

The physical arrangement of the field sensing electrode 60, the driven guard 62 and the reference shield 64 are illustrated in FIGS. 4 and 5. The field sensing electrode 60 is mounted on the forward or pointing end of the detector and extends in a plane generally transverse to the forward pointing reference direction of the detector. The forward pointing portion of the field sensing electrode is that portion influenced by the electrostatic field which impinges thereon from the front reference direction. The field sensing electrode 60 is adhered to a substrate 78. The driven guard 62 is positioned immediately behind the substrate 78 and is separated therefrom by spacers 80. The driven guard electrode 62 thereby surrounds substantially all of the field sensing electrode 60 except for the forward pointing portion of the electrode 60 which is influenced by the electrostatic field. The driven guard 62 is mounted on the forward face of a substrate 82 and the reference shield 64 is mounted on the rearward facing surface of the substrate 82. The electrode 60 and the shields 62 and 64 are electrical conductors, preferably of metallic material and these conductors are connected by wire-type conductors to the other circuit elements of the detector. The assembled components 60, 62, 64, 80 and 82 are operatively connected to the support element 58.

Referring to FIG. 3, output signals from the two electromagnetic transducers 40 and 42 are supplied to amplifiers 84 and 86, respectively. Similarly, the output signal from the electrostatic transducer 44 on conductor 74 is applied to amplifier 88. The amplifiers 84, 86 and 88 are preferably conventional radio frequency amplifiers and are capable of amplifying the high-frequency signals corresponding to the high-frequency component of the electromagnetic fields sensed by the transducers 40 and 42 and the electrostatic field sensed by the transducer 44. The amplified output signals from the amplifiers 84, 86 and 88 are respectively applied to conventional filter detectors 90, 92 and 94. Each of the filter detectors 90, 92 and 94 is conventional and includes a filter for sensing signals of frequency substantially only corresponding to the high-frequency component of the tracer signal and for supplying an output signal upon the detection of the predetermined high-frequency component. Further, the level of the signal supplied by each of the filter detectors 90, 92 and 94 relates to the magnitude or strength of each of the high-frequency signals detected. The signals sensed by the transducers 40, 42 and 44 which do not contain the predetermined high-frequency components corresponding to those of the tracer signal are suppressed as a result of the filtering function of filter detectors 90, 92 and 94.

The output signals from filter detectors 90 and 94 are added together at a summing junction 95, and the resulting summed signal is applied to the input terminal of an amplifier 96. The summed signal at the input terminal of amplifier 96 is amplified, and the output signal from amplifier 96 is applied to a level detector 98. Similarly, the output signals from detectors 92 and 94 are added together at a summing junction 99, and the resulting summed signal is applied to the input terminal of amplifier 100. The amplifier 100 amplifies the summed signal at its input terminal, and the output signal is applied to a level detector 102. The amplifiers 96 and 100 are conventional audio amplifiers which need response characteristics only within the low-frequency range of the cycle signal of the tracer signal generator, because the filter detectors apply continuous DC output signals when the high-frequency component is detected only during the first portion of the cycle envelope (portion 36 FIG. 2D).

The signal from the electrostatic transducer 44 is effectively added separately to each of the two signals from the electromagnetic transducers 40 and 42. By adding the signals from the electrostatic transducer to the signals from the electromagnetic transducers, a reliable detection capability remains even when shorts, opens, breaks, propagation peculiarities and flux wave cancelling effects adversely influence one of the electromagnetic or electrostatic components of the radiated field energy.

The output signals from the level detectors 98 and 102 are passed through resistors and summed as a single composite signal at a summing junction to which conductor 104 is attached. The composite signal on conductor 104 is applied to the input terminal of a controlled amplifier 106. The output signal from the amplifier 106 is a display signal which drives a conventional display 108. The display 108 may include the capability to present both visual and audio display indications. The signal on conductor 104 is also fed back to the amplifiers 84, 86 and 88 and is used in those amplifiers to control the gain of the amplifiers and thereby obtain sufficient amplification for detection of the electrostatic and electromagnetic fields created by the tracer signal.

In order to obtain the capability to sense directionality with the detector 12 and to create a display indication of directionality at the display 108, the signals from the detectors 98 and 102 are applied to a conventional difference amplifier 110. The amplifier 110 creates an output error signal related to the difference in magnitude of the output signals from the detectors 98 and 102. The output error signal from the difference amplifier is applied to a conventional absolute value generator 112. The absolute value generator 112 converts the error signal to its absolute value and supplies this absolute value error signal as a control signal to the controlled amplifier 106. When the error signal is small or nonexistent, i.e., the output signals from the level detectors 98 and 102 differ by a small or nonexistent amount, a low level or nonexistent control signal is applied to the amplifier 106, and the amplifier 106 achieves relatively high gain. The composite signal at the input terminal of the amplifier 116 is maximumly amplified. The display 108 presents a display indication of greater magnitude. When the difference in magnitude of the output signals from the level detectors 98 and 102 is great, and hence a large absolute value error signal is applied to control the amplifier 106, the amplifier 106 achieves relatively low or no gain. The composite signal is either not passed by the amplifier or if it is passed it is minimumly amplified. A relatively low level or weak display indication is created at the display 108. Although not shown, the absolute value of the error signal from the difference amplifier 110 could directly control a display arranged so that a low or non-existent error signal would create a maximum display indication.

An omnidirectional field reception capability is achieved by obtaining the composite signal from the addition of signals related to the electromagnetic field strengths caused along the two different angular orientations and the forward facing electrostatic field. The effects of adverse influences and cancelling flux patterns are eliminated or greatly reduced. However, a direction sensing capability is still retained even with the omnidirectional detection capability. By comparing the magnitude of the signals derived by the electromagnetic pickups 40 and 42 as described, a very narrow sensing path is available to create a display indication. Thus, if the detector is not pointed substantially in the direction of the tracer signal carrying conductor, no display indication will be presented. Once the detector becomes pointed in the direction of the conductor carrying the tracer signal, a display indication is presented which indicates the degree to which the detector is pointed at the conductor. Even the single electrostatic transducer achieves some measure of directionality. Because the field sensing electrode is oriented perpendicularly with respect to the forward pointing reference direction (FIGS. 4 and 5), the maximum electrostatic signal will be derived when the detector is pointed directly at the conductor. When the detector is pointed off to one side, the strength of the electrostatic field intercepted by the field sensing electrode will diminish and a lesser magnitude of display indication will result. Thus, even if one of the electromagnetic or electrostatic fields is ineffective for some reason, the directionality feature is preserved when detecting the effective field energy. By moving the detector from side to side and watching the strength of the display, the user can directly and quickly establish the direction and path taken by the conductor.

Substantial improvements result from this directionality feature. The effective physical dimensions of the sensing path can be made very precise and very narrow along the width of the path by adjusting the gain response of the amplifier 106 in response to the magnitude of the absolute value of the error signal. The electronic control over the precision or narrowness of the sensing path does not depend totally on the overlapping and somewhat imprecise nature of flux reception and cancellation patterns, but can be more precisely refined and defined as a result of the electrical difference comparison and gain control. Furthermore, only one display is necessary in order to provide the user with a distinct directionality capability due to the increase in magnitude of the display signal when the detector points more directly toward the conductor. The conductor can be more precisely and quickly traced as a result of the directionality feature.

In order to obtain the selective capability for distinguishing which one of a plurality of conductors in an adjoining group or bundle is carrying the tracer signal, a short range low-frequency electrostatic detection capability is provided in the detector 12. When a switch 116 is open, as shown in FIG. 3, the detector 12 operates as has been previously described to detect and respond to the high-frequency components of the tracer signal. When the switch 116 is closed, the output signal from the electrostatic transducer 44 on conductor 74 from the electrostatic transducer 44 is directly applied to the output terminal of filter detector 94 and is coupled to the input terminals of amplifiers 96 and 100. Closure of switch 116 bypasses the high-frequency amplifier 88 and the filter detector 94 and directly to passes the signal corresponding to the cycle frequency voltage offset (37, FIG. 2D) to the summing junctions 95 and 99. A signal of the same magnitude is thus applied to both the amplifiers 96 and 100 and to the level detectors 98 and 102. The major component of the composite signal on conductor 104 results from the voltage offset characteristics of the tracer signal, and the display indication supplied at the display 108 relates to the detected strength and effects of this voltage offset.

The short range detection capability, and hence the ability to distinguish among individual ones of a group of conductors, is achieved because of the electrostatic field effects created by the voltage offset component of the tracer signal occur at a relatively low frequency, preferably an audio frequency. The electrostatic field does not readily couple to the adjoining conductors in the group bundle due to its relatively low frequency. Hence, the low-frequency electrostatic field surrounds substantially only the conductor which carries the tracer signal. By placing the detector in very close adjacency to each one of the conductors in the bundle, that is, place the electrostatic field sensing electrode 60 very close to each of the conductors, after closing the switch 116, it is quickly apparent which one of the individual conductors carries the tracer signal. The relatively low frequency of the voltage offset component of the tracer signal in combination with the selective control of the detector by opening and closing switch 116 to distinguish between the high-frequency electrostatic components and the low-frequency electrostatic components, obtains substantial improvements in identifying the single tracer signal-carrying conductor in a closely grouped plurality of adjacent conductors.

An embodiment of the present invention has been shown and described with a degree of specificity. It should be understood, however, that the specificity of this description has been made by way of preferred example, and that the invention itself is defined by the scope of the appended claims.

What is claimed is:

1. In an apparatus for tracing and identifying an electrical conductor or the like, comprising generator means in combination with detector means, the generator means operatively generating a predetermined tracer signal and applying the tracer signal to the conductor, the predetermined tracer signal having a high frequency component wherein the voltage fluctuates at a predetermined high frequency, the tracer signal creating corresponding fluctuating electromagnetic and electrostatic fields from the conductor when the tracer signal is applied to the conductor, the detector means operatively detecting at least one of the electromagnetic or electrostatic fields when the detector means is placed in operative proximity with the conductor, and an improvement comprising:

electromagnetic transducer means of said detector means, the electromagnetic transducer being responsive to electromagnetic fields and being operative for supplying an output signal related to the electromagnetic field from the conductor created by the tracer signal when said detector means is placed in operative proximity to the conductor carrying the tracer signal;

electrostatic transducer means of said detector means, the electrostatic transducer being responsive to electrostatic fields and being operative for supplying an output signal related to the electrostatic field from the conductor created by the tracer signal when said detector means is placed in operative proximity to the conductor carrying the tracer signal;

first filter detector means responsive to the output signal from the electromagnetic transducer means and operative for detecting signals substantially only at the predetermined high frequency and for supplying a first detector output signal related to the magnitude of the signal at the predetermined high frequency detected by the electromagnetic transducer means;

second filter detector means responsive to the output signal from the electrostatic transducer means and operative for detecting signals substantially only at the predetermined high frequency and for supplying a second detector output signal related to the magnitude of the signal at the predetermined high frequency detected by the electrostatic transducer means;

combining means receptive of the detector output signals and operative for combining the first and second detector output signals to thereby obtain a composite signal; and means for including a display responsive to the composite signal and operative for supplying a display indication related to the composite signal.

2. Apparatus as defined in claim 1 wherein the electrostatic transducer means further comprises:

a field sensing electrodce operatively influenced by electrostatic fields, the field sensing electrode having a portion operative to be primarily influenced by the electrostatic field from the conductor created by the tracer signal;

a driven shield electrode spaced from the field sensing electrode and substantially surrounding the field sensing electrode except at the portion operative to be primarily influenced by the electrostatic field from the conductor created by the tracer signal;

amplifier means having an input terminal and an output terminal, said amplifier means supplying an output signal at the output terminal of magnitude substantially equal to the magnitude of an input signal applied to the input terminal; and the input terminal of the amplifier means electrically connected to the field sensing electrode and the output terminal of the amplifier means electrically connected to the driven shield electrode to feed back the voltage signal created by an electrostatic field on the field sensing electrode as a voltage of approximately the same magnitude on the driven shield electrode to substantially eliminate the adverse influences of stray and background electrostatic fields on the field sensing electrode.

3. Apparatus as defined in claim 2:

wherein the tracer signal is characterized by a repetitious cycle envelope occurring at a predetermined low cycle frequency which is substantially less than the predetermined high frequency, the cycle envelope has a first portion and a second portion, the first portion of the cycle envelope having a predetermined voltage level modulated by the high-frequency signal to a predetermined extent that the minimum voltage during the first portion is greater by a predetermined offset amount than the voltage of the tracer signal during the second portion of the cycle envelope, the second portion of the cycle envelope having no high-frequency signal component;

further comprising selective means connected to the output terminal of the amplifier means and responsive to the amplifier output signal and operative for selectively supplying a voltage offset signal at the predetermined low cycle frequency to the combining means, the voltage offset signal being related to and derived from the predetermined offset amount of voltage of the first portion of the cycle envelope; and wherein the combining means is also operative to combine the voltage offset signal as a component of the composite signal.

4. Apparatus as defined in claim 1:

wherein the tracer signal is characterized by a repetitious cycle envelope occurring at a predetermined low cycle frequency which is substantially less than the predetermined high frequency, the cycle envelope has a first portion and a second portion, the first portion of the cycle envelope having a predetermined voltage level modulated by the high frequency signal to a predetermined extent that the voltage during the first portion is greater by a predetermined offset amount than the voltage of the tracer signal during the second portion of the cycle envelope, the second portion of the cycle envelope having no high frequency signal component;

further comprising a selective means connected to receive the output signal from the electrostatic transducer means and operative for selectively supplying a voltage offset signal at the predetermined cycle frequency to the combining means, the voltage offset signal being related to and derived from the predetermined offset amount of voltage of the first portion of the cycle envelope; and wherein the combining means is also operative to combine the voltage offset signal as a component of the composite signal.

5. Apparatus as defined in claim 4 wherein the electrostatic transducer means further comprises:

a field sensing electrode operatively influenced by electrostatic fields, the field sensing electrode having a portion operative to be primarily influenced by the electrostatic field from the conductor created by the tracer signal;

a driven shield electrode spaced from the field sensing electrode and substantially surrounding the field sensing electrode except at the portion operative to be primarily influenced by the electrostatic field from the conductor created by the tracer signal; and voltage follower amplifier means having an input terminal electrically connected to the field sensing electrode and an output terminal electrically connected to the driven shield electrode.

6. Apparatus as defined in claim 1 further comprising:

second electromagnetic transducer means in addition to the electromagnetic transducer means first aforesaid, the second electromagnetic transducer means being responsive to electromagnetic fields and being operative for supplying an output signal related to the electromagnetic field from the conductor created by the tracer signal when said detector means is placed in operative proximity to the conductor carrying the tracer signal;

third filter detector means responsive to the output signal from the second electromagnetic transducer means and operative for detecting signals substantially only at the predetermined high frequency and for supplying a third detector output signal related to the magnitude of the signal at the predetermined high frequency detected by the second electromagnetic transducer means;

each electromagnetic transducer means having a maximum responsiveness to the intercepted electromagnetic field along a predetermined axis of each respective electromagnetic transducer means;

each electromagnetic transducer means supplying an output signal related to the strength of the intercepted electromagnetic fields;

means positioning the first and second electromagnetic transducer means with the axes of each electromagnetic transducer at its own predetermined angle with respect to a reference direction of said detector means; and means responsive to the first, second and third detector output signals and operative for supplying an error signal representative of the relative strength of the first and third detector output signals; and wherein said means including the display is also responsive to the error signal and supplies a display indication related in a predetermined manner to the error signal and the composite signal.

7. Apparatus as defined in claim 6 wherein:

said combining means operatively combines the first and second detector output signals to obtain a first partial composite signal and operatively combines the second and third detector output signals to obtain a second partial composite signal and then operatively combines the first and second partial composite signals to obtain the composite signal; and said means operative for supplying the error signal operatively obtains the error signal by comparing the first and second partial composite signals.

8. Apparatus as defined in claim 6:

wherein the tracer signal is characterized by a repetitious cycle envelope occurring at a predetermined low cycle frequency which is substantially less than the predetermined high frequency, the cycle envelope has a first portion and a second portion, the first portion of the cycle envelope having a predetermined voltage level modulated by the high frequency signal to a predetermined extent that the voltage during the first portion is greater by a predetermined offset amount than the voltage of the tracer signal during the second portion of the cycle envelope, the second portion of the cycle envelope having no high frequency signal component;

further comprising selective means connected to receive the output signal from the electrostatic transducer means and operative for selectively supplying a voltage offset signal at the predetermined cycle frequency to the combining means, the voltage offset signal being related to and derived from the predetermined offset amount of voltage of the first portion of the cycle envelope; and wherein the combining means is also operative to combine the voltage offset signal as a component of the composite signal.

9. Apparatus as defined in claim 8 wherein the electrostatic transducer means further comprises:

a field sensing electrode operatively influenced by electrostatic fields, the field sensing electrode having a portion operative to be primarily influenced by the electrostatic field from the conductor created by the tracer signal;

a driven shield electrode spaced from the field sensing electrode and substantially surrounding the field sensing electrode except at the portion operative to be primarily influenced by the electrostatic field from the conductor created by the tracer signal;

amplifier means having an input terminal and an output terminal, said amplifier means supplying an output signal at the output terminal of magnitude substantially equal to the magnitude of an input signal applied to the input terminal; and the input terminal of the amplifier means is electrically connected to the field sensing electrode and the output terminal of the amplifier means is electrically connected to the driven shield electrode to feed back the voltage signal created by an electrostatic field on the field sensing electrode as a voltage of approximately the same mangitude on the driven shield electrode to substantially eliminate the adverse influences of stray and background electrostatic fields on the field sensing electrode.

10. Apparatus as defined in claim 6 wherein:

said detector further operatively indicates the direction of the conductor with respect to a reference direction of the detector;

each electromagnetic transducer means has a maximum responsiveness to an intercepted electromagnetic field along a predetermined axis;

the combining means is also operative for combining the third detector output signal as a component of the composite signal; and the first and second electromagnetic transducer means are positioned with the axes of each electromagnetic transducer means intersecting one another at a predetermined intersection angle and with a bisector of the predetermined intersection angle extending in the reference direction of the detector means.

11. Apparatus as defined in claim 10 wherein the predetermined intersection angle is within the range of ninety degrees to one hundred eighty degrees.

12. Apparatus as defined in claim 11 wherein the predetermined intersection angle is approximately one hundred twenty degrees.

13. Apparatus as defined in claim 2 further comprising:

a reference shield electrode spaced from the driven shield electrode on a side opposite from the field sensing electrode, said reference shield electrode being electrically connected to reference potential of said detector means.

14. In an apparatus for tracing and identifying an electrical conductor or the like, said apparatus comprising generator means in combination with detector means, the generator means operatively generating a predetermined tracer signal and applying the tracer signal to the conductor, the tracer signal creating predetermined electromagnetic and electrostatic fields about the conductor, the detector means operatively detecting at least one of the electromagnetic or electrostatic fields when the detector means is placed in operative proximity with the conductor, and an improvement in combination therewith comprising:

tracer signal generating means of the said generator means which is operative for generating a tracer signal characterized by repetitious cycle envelopes repeating at a predetermined repetition frequency, each cycle envelope including a first portion and a second portion, the tracer signal having a voltage level during the first portion which fluctuates at a predetermined high frequency and which is substantially different by a predetermined offset voltage amount that the voltage present during the second portion of the cycle envelope, the predetermined repetition frequency being substantially less than radio frequency, and the predetermined high frequency being a radio frequency;

electromagnetic transducer means of said detector means, the electromagnetic transducer responding to the predetermined electromagnetic field about the conductor and supplying an output signal related to the electromagnetic field about the conductor when said detector means is placed in operative proximity to the conductor carrying the tracer signal;

electrostatic transducer means of said detector means, the electrostatic transducer means responding to the predetermined electrostatic field about the conductor and supplying an output signal related to the electrostatic field about the conductor when said detector means is placed in operative proximity to the conductor carrying the tracer signal;

means responsive to the output signals from the transducer means and operative for creating a composite signal related to the combination of the detector output signals; and means including a display responsive to the composite signal and operative for supplying the display indication related to the composite signal.

15. Apparatus as defined in claim 14 wherein the electrostatic transducer means further comprises:
   a field sensing electrode operatively influenced by electrostatic fields, the field sensing electrode having a portion operative to be primarily influenced by the electrostatic field from the conductor created by the tracer signal;
   a driven shield electrode spaced from the field sensing electrode and substantially surrounding the field sensing electrode except at the portion operative to be primarily influenced by the electrostatic field from the conductor created by the tracer signal;
   amplifier means having an input terminal and an output terminal, said amplifier means supplying an output signal at the output terminal of magnitude substantially equal to the magnitude of an input signal applied to the input terminal; and
   the input terminal of the amplifier means electrically connected to the field sensing electrode and the output terminal of the amplifier means electrically connected to the driven shield electrode to feed back the voltage signal created by an electrostatic field on the field sensing electrode as a voltage of approximately the same magnitude on the driven shield electrode to substantially eliminate the adverse influences of stray and background electrostatic fields on the fields sensing electrode.

16. An invention as defined in claim 15 further comprising:
   selective means connected to the output terminal of the amplifier means and responsive to the amplifier output signal and operative for selectively supplying a voltage offset signal at the predetermined low cycle frequency to the combining means, the voltage offset signal being related to and derived from the predetermined offset amount of voltage of the first portion of the cycle envelope.

17. An invention as defined in claim 14 further comprising:
   filter detector means responsive to the output signal from the electromagnetic transducer means and operative for detecting signals substantially only at the predetermined high frequency and for supplying to said combining means a detector output signal related to the magnitude of the signal from the electromagnetic transducer means at the predetermined high frequency.

18. An invention as defined in claim 14 further comprising:
   filter detector means responsive to the output signal from the electrostatic transducer means and operative for detecting signals substantially only at the predetermined high frequency and for supplying to said combining means an eletrostatic detector output signal related to the magnitude of the signal from the electrostatic transducer means at the predetermined high frequency.

19. An invention as defined in claim 18 further comprising:
   switch means electrically connected for supplying a signal from the electrostatic transducer means to the combining means and bypassing the filter detector means.

20. An invention as defined in claim 19 further comprising:
   filter detector means responsive to the output signal from the electromagnetic transducer means and operative for detecting signals substantially only at the predetermined high frequency and for supplying to said combining means a first electromagnetic detector output signal related to the magnitude of the signal from the aforesaid electromagnetic transducer means at the predetermined high frequency;
   a second electromagnetic transducer means in addition to the electromagnetic transducer means first aforesaid, said second electromagnetic transducer means responding to the predetermined electromagnetic field about the conductor and supplying an output signal related to the electromagnetic field about the conductor when said detector means is placed in operative proximity to the conductor carrying the tracer signal;
   filter detector means responsive to the output signal from the second electromagnetic transducer means and operative for detecting signals substantially only at the predetermined high frequency and for supplying to said combining means a second electromagnetic detector output signal related to the magnitude of the signal from the second electromagnetic transducer means at the predetermined high frequency;
   each electromagnetic transducer means having a maximum responsiveness to an intercepted electromagnetic field along a predetermined axis of each respective electromagnetic transducer means;
   the predetermined axis of each electromagnetic transducer means being oriented at an intersecting angle with respect to the predetermined axis of the other electromagnetic transducer means;
   said electrostatic transducer means having an orientation extending along the bisector of the intersecting angle for maximumly responding to electrostatic fields.

* * * * *